United States Patent
Park et al.

(10) Patent No.: US 9,461,148 B2
(45) Date of Patent: Oct. 4, 2016

(54) SEMICONDUCTOR DEVICE AND METHOD OF FABRICATING THE SAME

(71) Applicants: Jae-Young Park, Yongin-si (KR); Ji-Hoon Cha, Seoul (KR); Jae-Jik Baek, Seongnam-si (KR); Bon-Young Koo, Suwon-si (KR); Kang-Hun Moon, Seoul (KR); Bo-Un Yoon, Seoul (KR)

(72) Inventors: Jae-Young Park, Yongin-si (KR); Ji-Hoon Cha, Seoul (KR); Jae-Jik Baek, Seongnam-si (KR); Bon-Young Koo, Suwon-si (KR); Kang-Hun Moon, Seoul (KR); Bo-Un Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 224 days.

(21) Appl. No.: 13/799,291

(22) Filed: Mar. 13, 2013

(65) Prior Publication Data

US 2014/0220752 A1 Aug. 7, 2014

(30) Foreign Application Priority Data

Feb. 4, 2013 (KR) .................. 10-2013-0012529

(51) Int. Cl.
*H01L 21/8234* (2006.01)
*H01L 29/66* (2006.01)

(52) U.S. Cl.
CPC .............. *H01L 29/66795* (2013.01)

(58) Field of Classification Search
CPC .................................................. H01L 21/8234
See application file for complete search history.

(56) References Cited

U.S. PATENT DOCUMENTS

| 7,332,386 | B2 | 2/2008 | Lee et al. | |
| 2005/0250279 | A1* | 11/2005 | Son et al. | 438/216 |
| 2006/0160306 | A1 | 7/2006 | Huang et al. | |
| 2006/0175669 | A1 | 8/2006 | Kim et al. | |
| 2008/0048262 | A1 | 2/2008 | Lee et al. | |
| 2010/0015778 | A1 | 1/2010 | Lin et al. | |
| 2012/0034791 | A1 | 2/2012 | Lay et al. | |
| 2012/0126883 | A1 | 5/2012 | Juengling | |
| 2012/0309151 | A1* | 12/2012 | Zhang et al. | 438/285 |
| 2013/0285143 | A1* | 10/2013 | Oh et al. | 257/347 |
| 2014/0187013 | A1* | 7/2014 | Xu | H01L 29/66803 438/305 |

FOREIGN PATENT DOCUMENTS

| KR | 1020080060930 | 7/2008 |
| KR | 1020100048121 | 5/2010 |
| KR | 1020100115890 | 10/2010 |

* cited by examiner

*Primary Examiner* — Marvin Payen
(74) *Attorney, Agent, or Firm* — Myers Bigel & Sibley, P.A.

(57) ABSTRACT

A method of fabricating a semiconductor device is described. The method of fabricating a semiconductor device comprises providing a fin formed to protrude from a substrate and a plurality of gate electrodes formed on the fin to intersect the fin; forming first recesses in the fin on at least one side of the respective gate electrodes; forming an oxide layer on the surfaces of the first recesses; and expanding the first recesses into second recesses by removing the oxide layer. Related devices are also disclosed.

16 Claims, 14 Drawing Sheets

SEMICONDUCTOR DEVICE AND METHOD OF FABRICATING THE SAME

This application claims priority from Korean Patent Application No, 10-2013-0012529 filed on Feb. 4, 2013 in the Korean Intellectual Property Office, the disclosure of which is incorporated herein by reference in its entirety.

BACKGROUND

The present inventive concept relates to a semiconductor device and a method of fabricating the same.

As a scaling technique for increasing the density of semiconductor devices, multi-gate transistors, which are obtained by forming a fin-shaped silicon body on a substrate and forming gates on the surface of the silicon body, have been suggested.

Since multi-gate transistors use three-dimensional (3D) channels, they may be scaled. In addition, the current control capability of multi-gate transistors can be improved without the need to increase the gate length. Moreover, a short channel effect (SCE), in the electric potential in a channel region is affected by a drain voltage, can be suppressed.

SUMMARY

Embodiments of the present inventive concept provide a semiconductor device which can provide clean epitaxial growth surfaces by forming recesses with smooth surfaces.

Embodiments of the present inventive concept also provide a method of fabricating a semiconductor device which can provide clean epitaxial growth surfaces by forming recesses with smooth surfaces.

However, the present inventive concept is not restricted to the one embodiments set forth herein. The above and other embodiments of the present inventive concept will become more apparent to one of ordinary skill in the art to which the present inventive concept pertains by referencing the detailed description of the present inventive concept given below.

According to some embodiments of the present inventive concept, a method of fabricating a semiconductor device comprises providing a fin to protrude from a substrate and a plurality of gate electrodes on the fin to intersect the fin; forming first recesses in the fin on at least one side of the respective gate electrodes; forming an oxide layer on the surfaces of the first recesses; and expanding the first recesses into second recesses by removing the oxide layer.

According to other embodiments of the present inventive concept, a semiconductor device comprises a fin to protrude from a substrate; a plurality of gate electrodes formed on the fin to intersect the fin; a gate spacer formed on at least one sidewall of each of the gate electrodes; a source/drain region on at least one side of each of the gate electrodes; and a silicide layer on the source/drain regions, wherein a width of the source/drain regions is greater than a pitch of the gate spacers and bottom surfaces of the gate spacers and sides of the source/drain regions substantially form a right angle.

BRIEF DESCRIPTION OF THE DRAWINGS

The above and other advantages of the present inventive concept will become more apparent by describing in detail exemplary embodiments thereof with reference to the attached drawings, in which.

DETAILED DESCRIPTION OF THE EMBODIMENTS

Figure 1:
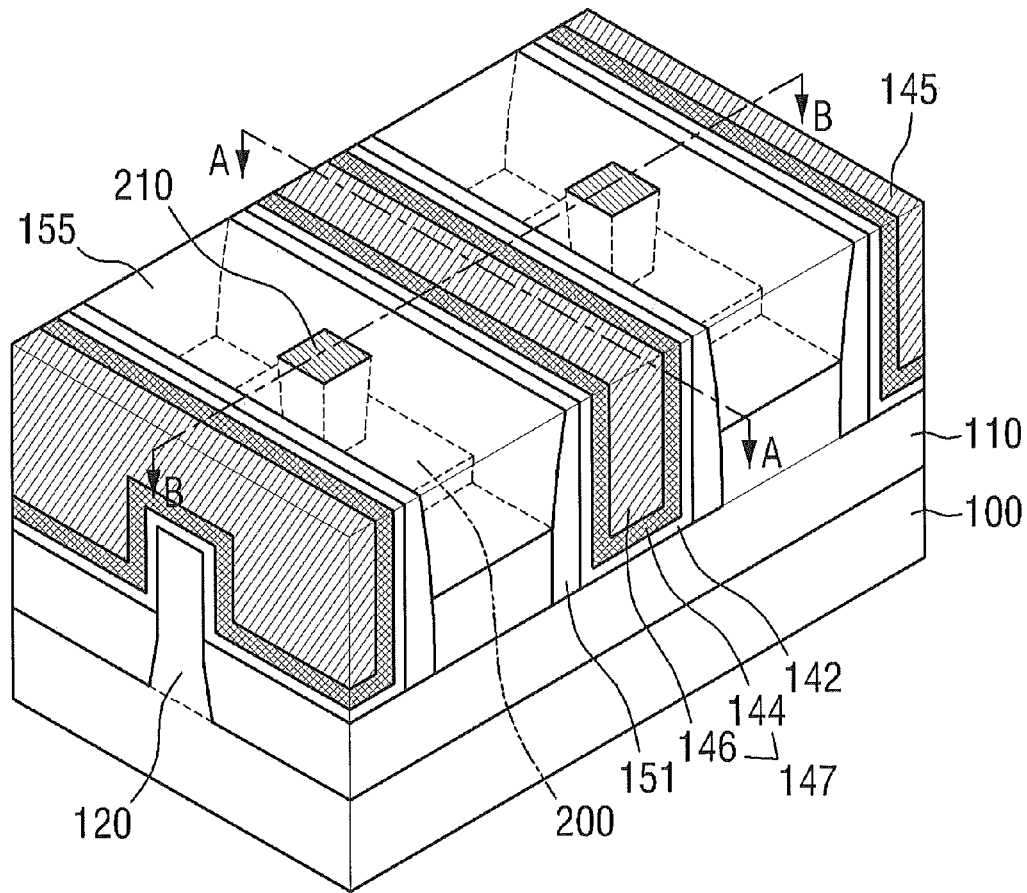
FIG. 1 is a perspective view illustrating a semiconductor device according to various embodiments of the present inventive concept.

Embodiments of the present inventive concept will now be described more fully hereinafter with reference to the accompanying drawings. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

The use of the terms "a" and "an" and "the" and similar referents in the context of describing embodiments of the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A semiconductor device according to some embodiments of the present inventive concept will now be described with reference to FIGS. 1 through 3.

FIG. 1 is a perspective view illustrating a semiconductor device according to some embodiments of the present inventive concept. FIG. 2 is a cross-sectional view taken along line A-A of FIG. 1. FIG. 3 is a cross-sectional view taken along line B-B of FIG. 1.

Figure 2:
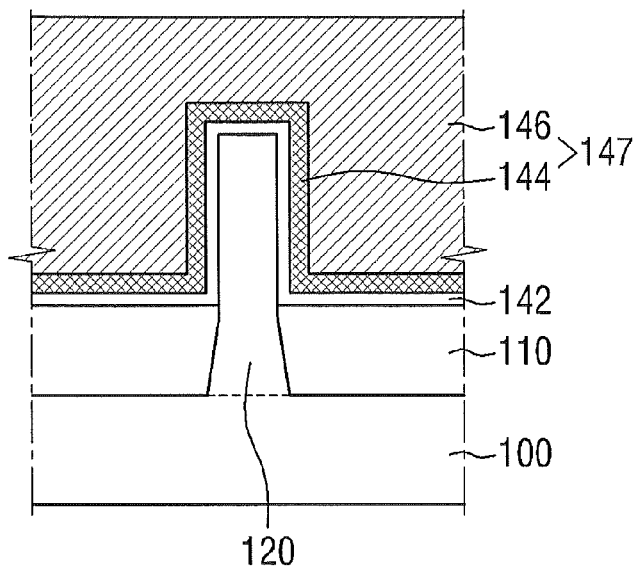
FIG. 2 is a cross-sectional view taken along line A-A of FIG. 1.
Figure 3:
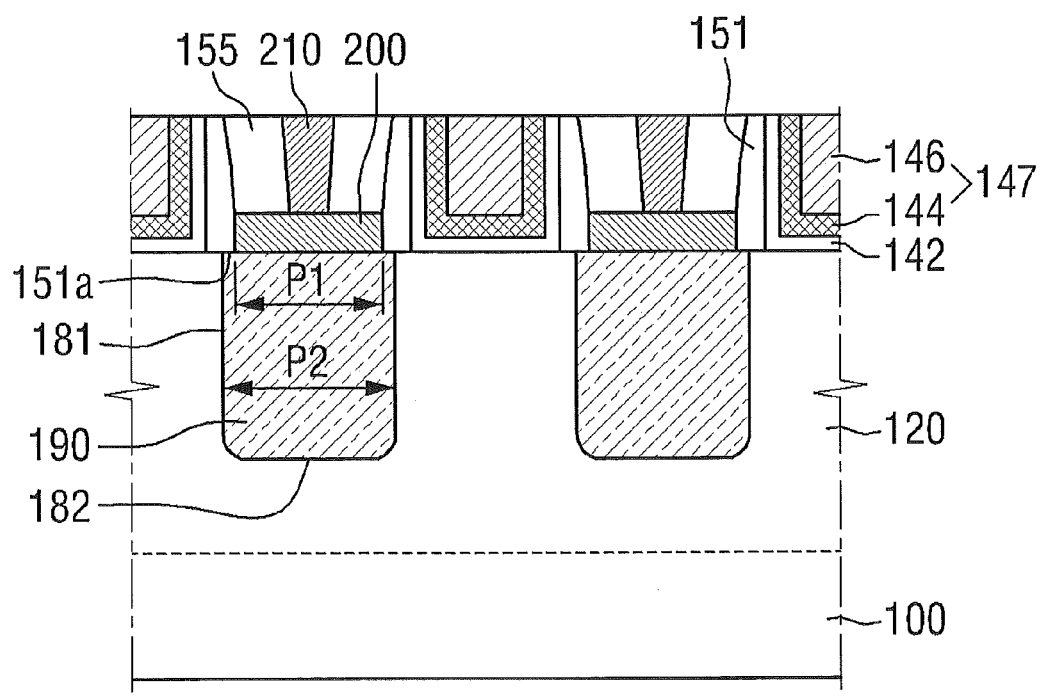
FIG. 3 is a cross-sectional view taken along line B-B of FIG. 1.

Referring to FIGS. 1 through 3, the semiconductor device may include a fin 120, a plurality of gate electrodes 147 and a plurality of source/drain regions 190.

The fin 120 may extend along a second direction Y1. The fin 120 may be part of a substrate 100 or may include an epitaxial layer grown from the substrate 100. The fin 120 may be formed to protrude from the top surface of the substrate 100. A device isolation layer 110 may cover the top surface of the substrate 100 and the sidewalls of the fin 120.

The gate electrodes 147 may be formed on the fin 120 to intersect the fin 120. The gate electrodes 147 are isolated from one another. The gate electrodes 147 may extend along a first direction X1.

Each of the gate electrodes 147 may include first and second metal layers 144 and 146. As illustrated in FIGS. 1 through 3, each of the gate electrodes 147 may include a stack of two or more metal layers (for example, the first and second metal layers 144 and 146). The first metal layer 144 adjusts a work function, and the second metal layer 146 fills the space formed by the first metal layer 144. In an example, the first metal layer 144 may include at least one of Mo, Pd, Ru, Pt, TiN, WN, TaN, Ir, TaC, RuN, TiAl, TaAlC, TiAlN and MoN, and the second metal layer 146 may include W or Al. The gate electrodes 147 may also be formed of a material other than a metal, such as Si or SiGe. In an example, the gate electrodes 147 may be formed by, but is not limited to, replacement.

A gate insulation layer 142 may be formed between the fin 120 and the gate electrodes 147. As illustrated in FIG. 2, the gate insulation layer 142 may be formed on the top surface of the fin 120 and upper parts of the sidewalls of the fin 120. The gate insulation layer 142 may also be disposed between the gate electrodes 147 and the device isolation layer 110. The gate insulation layer 142 may include a high dielectric material having a higher dielectric constant than a silicon oxide layer. In an example, the gate insulation layer 142 may include HfSiON, $HfO_2$, $ZrO_2$ or $Ta_2O_5$.

A capping layer (not shown) may be formed between the gate electrodes 147 and the gate insulation layer 142. The capping layer may be necessary to adjust a work function. More specifically, the capping layer serves as a buffer between the first metal layer 144 and the gate insulation layer 142. A work function can be more precisely adjusted when the capping layer is provided than when only the first metal layer 144 is provided with no capping layer. In an example, the capping layer may include, but is not limited to, at least one of LaO, GdO, DyO, SrO, BaO, an aluminum oxide layer and an aluminum metal oxide layer.

The source/drain regions 190 are formed in the fin 120 on at least one side of the respective gate electrodes 147. The source/drain regions 190 may be formed as elevated source/drain regions. That is, the top surfaces of the source/drain regions 190 may be higher than the bottom surface of an interlayer insulating film 155. The source/drain regions 190 and the gate electrodes 147 may be insulated from each other by gate spacers 151. The gate spacers 151 may be formed on at least one sidewall of the respective gate electrodes 147.

Referring to FIG. 3, the source/drain regions 190 may be U-shaped along the second direction Y1. That is, the interfaces between the fin 120 and the source/drain regions 190 may be U-shaped. Side surfaces 181 of the source/drain regions 190 may form an angle of 87 to 90 degrees with bottom surfaces 151a of the gate spacers 151. That is, the bottom surfaces 151a of the gate spacers 151 and the side surfaces 181 of the source/drain regions 190 may substantially form a right angle with each other. If the angle between two elements ranges between 87 degrees and 90 degrees, the two elements are assumed to substantially form a right angle with each other. Source/drain regions 180 may have a bottom surface 182.

A width P2 of the source/drain regions 190 may be greater than a pitch P1 of the gate spacers 151. The pitch P1 may indicate the distance between a pair of adjacent gate spacers 151. Since the width P2 is greater than the pitch P1, the bottom surfaces 151a of the gate spacers 151 may partially contact the source/drain regions 190. However, the source/drain regions 190 do not contact the gate insulation layer 142.

Figure 14:
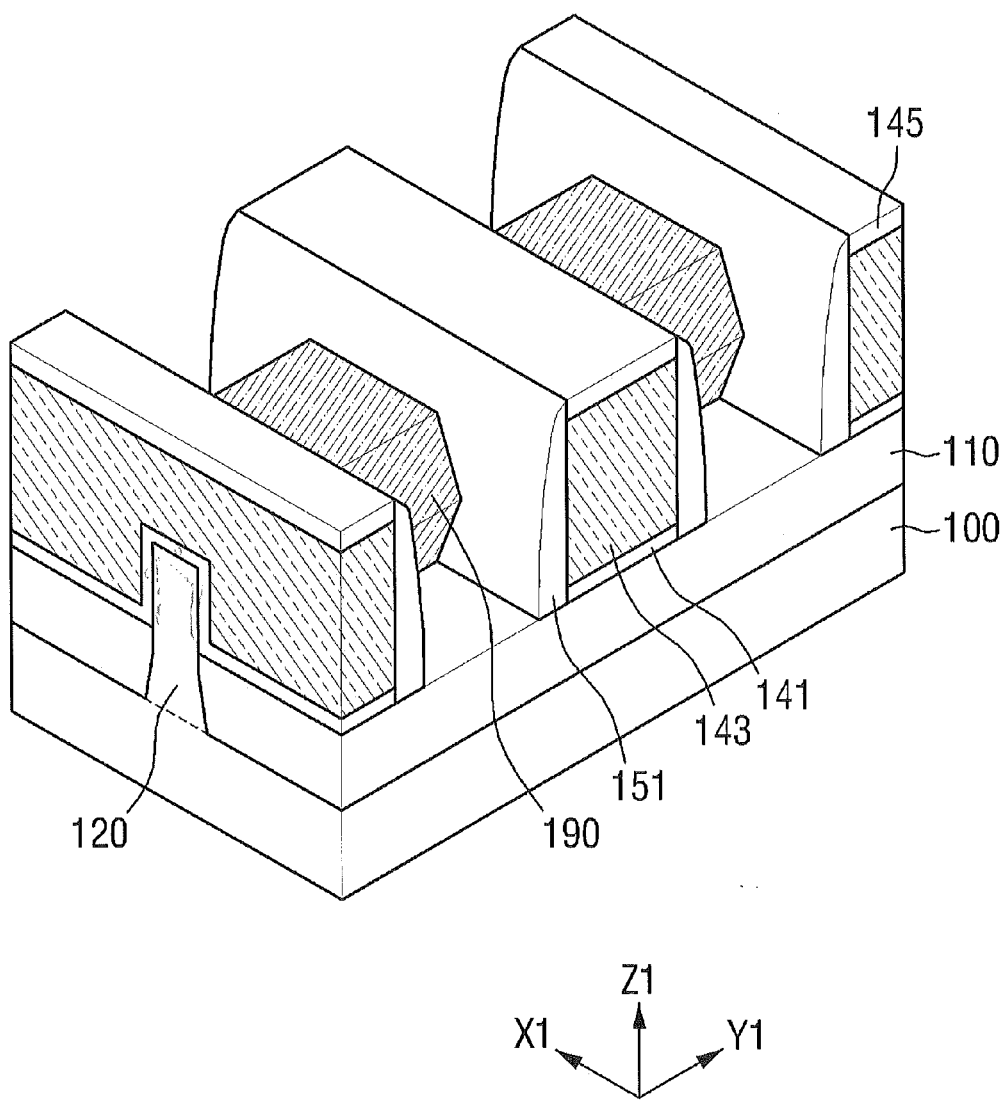

Even though not specifically illustrated in FIG. 1, the width of the source/drain regions 190 in the first direction X1 may be greater than the width of the fin 120, as illustrated in FIG. 14.

In response to the semiconductor device illustrated in FIGS. 1 through 3 being a P-type metal-oxide-semiconductor (PMOS) transistor, the source/drain regions 190 may include a compressive stress material. In an example, the compressive stress material may be a material having a greater lattice constant than Si, such as SiGe. The compressive stress material may improve the mobility of carriers in a channel region by applying compressive stress to the fin 120.

Alternatively, in response to the semiconductor device illustrated in FIGS. 1 through 3 being an N-type metal-oxide-semiconductor (NMOS) transistor, the source/drain regions 190 may include the same material as the substrate 100 or a tensile stress material. In an example, in a case in which the substrate 100 includes Si, the source/drain regions 190 may include Si or a material (such as SiC) having a smaller lattice constant than Si.

A silicide layer 200 may be formed over the source/drain regions 190. Contacts 210 may be formed on the silicide layer 200. The silicide layer 200 may be formed between the source/drain regions 190 and the contacts 210, and may thus reduce the surface resistance and the contact resistance therebetween. The source/drain regions 190, the silicide layer 200 and the contacts 210 may be surrounded by the interlayer insulating film 155.

The gate spacers 151 may include at least one of a nitride layer and an oxynitride layer.

The substrate 100 may be formed of one or more semiconductor materials selected from among Si, Ge, SiGe, GaP, GaAs, SiC, SiGeC, InAs and InP. Alternatively, a silicon-on-insulator (SOI) substrate may be used as the substrate 100.

A semiconductor device according to another embodiment of the present inventive concept will now be described with reference to FIGS. 4 through 6.

Figure 4:
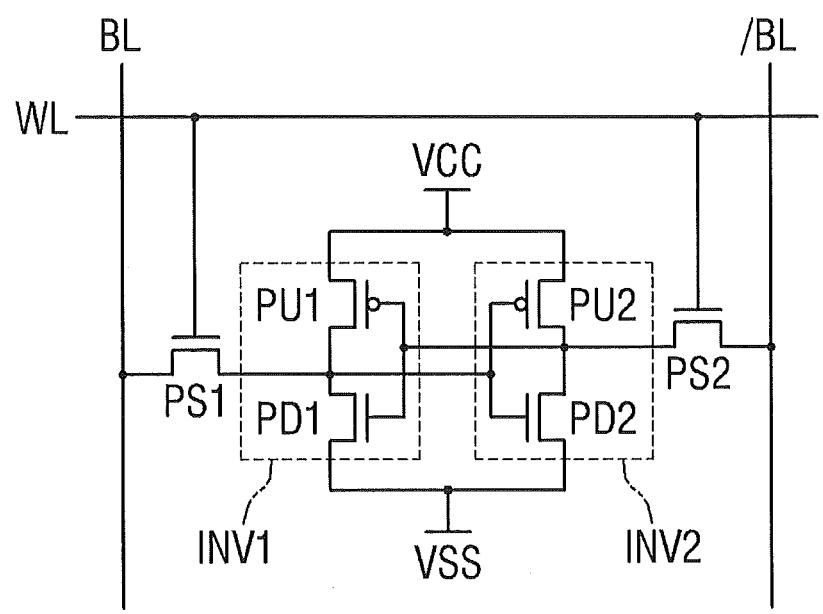
FIGS. 4 and 5 are a circuit diagram and a layout illustrating a semiconductor device according to various embodiments of the present inventive concept.
Figure 5:
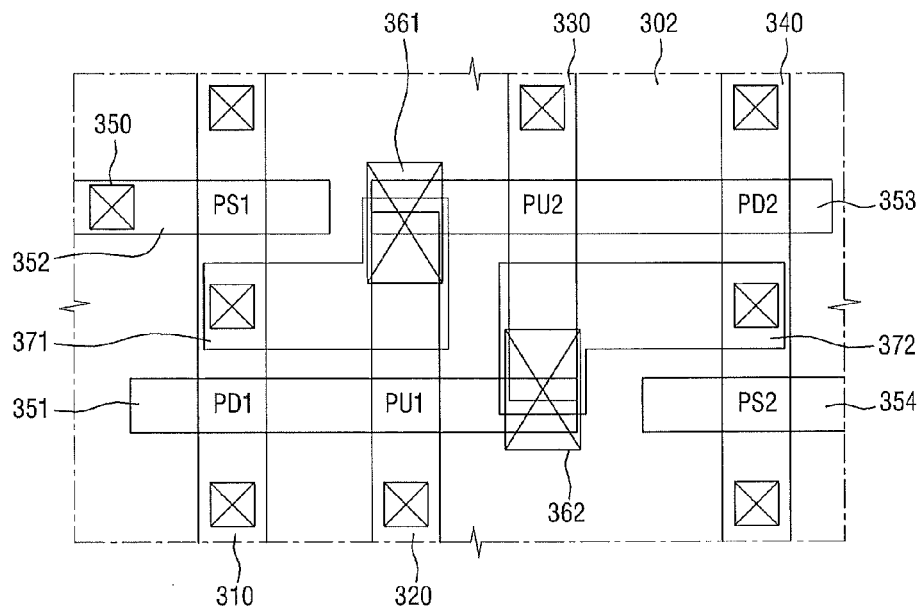

FIGS. 4 and 5 are a circuit diagram and a layout illustrating a semiconductor device according to various embodiments of the present inventive concept. FIG. 6 is a schematic layout illustrating a plurality of pins and a plurality of electrodes of the semiconductor device illustrated in FIG. 5, according to various embodiments. The semiconductor device according to some embodiments of the present inventive concept can be applied to nearly all types of devices including typical logic devices that use fin-type transistors. However, for convenience, a static random-access memory (SRAM) is illustrated in FIGS. 4 through 6 as an example semiconductor device.

Referring to FIG. 4, the semiconductor device according to another embodiment of the present inventive concept may include a pair of first and second inverters INV1 and INV2 connected in parallel between a power source node VCC and a ground node VSS and first and second pass transistors PS1 and PS2 respectively connected to the output nodes of the first and second inverters INV1 and INV2. The first and second pass transistors PS1 and PS2 may be connected to a bit line BL and a complementary bit line BL/, respectively. The gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be PMOS transistors, and the first and second pull-down transistors PD1 and PD2 may be NMOS transistors.

The input node of the first inverter INV1 is connected to the output node of the second inverter INV2, and the input node of the second inverter INV2 is connected to the output node of the first inverter INV1 so as for the first and second inverters INV1 and INV2 to form a single latch circuit.

Figure 6:
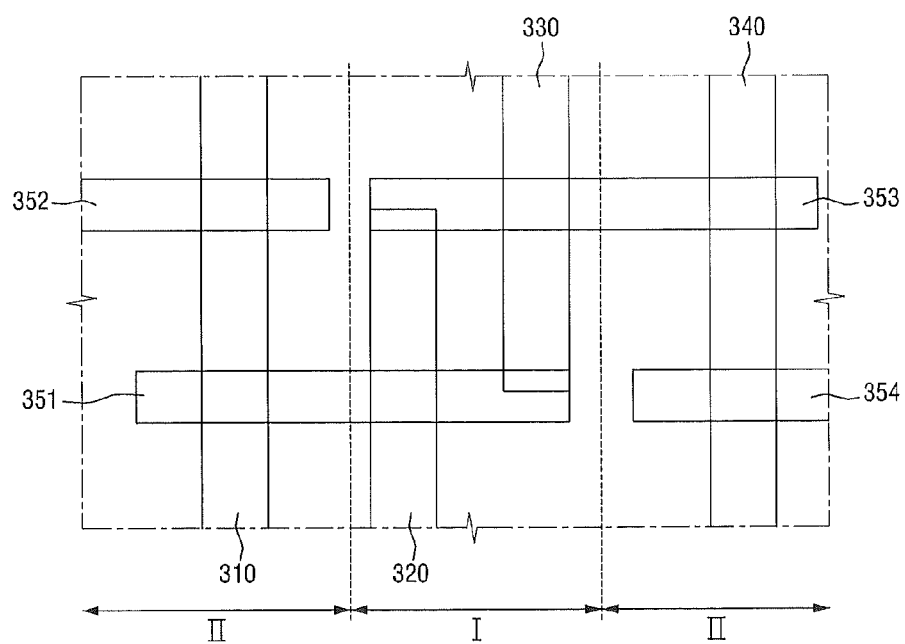
FIG. 6 is a schematic layout illustrating a plurality of pins and a plurality of electrodes of the semiconductor device illustrated in FIG. 5, according to various embodiments.
Figure 9:
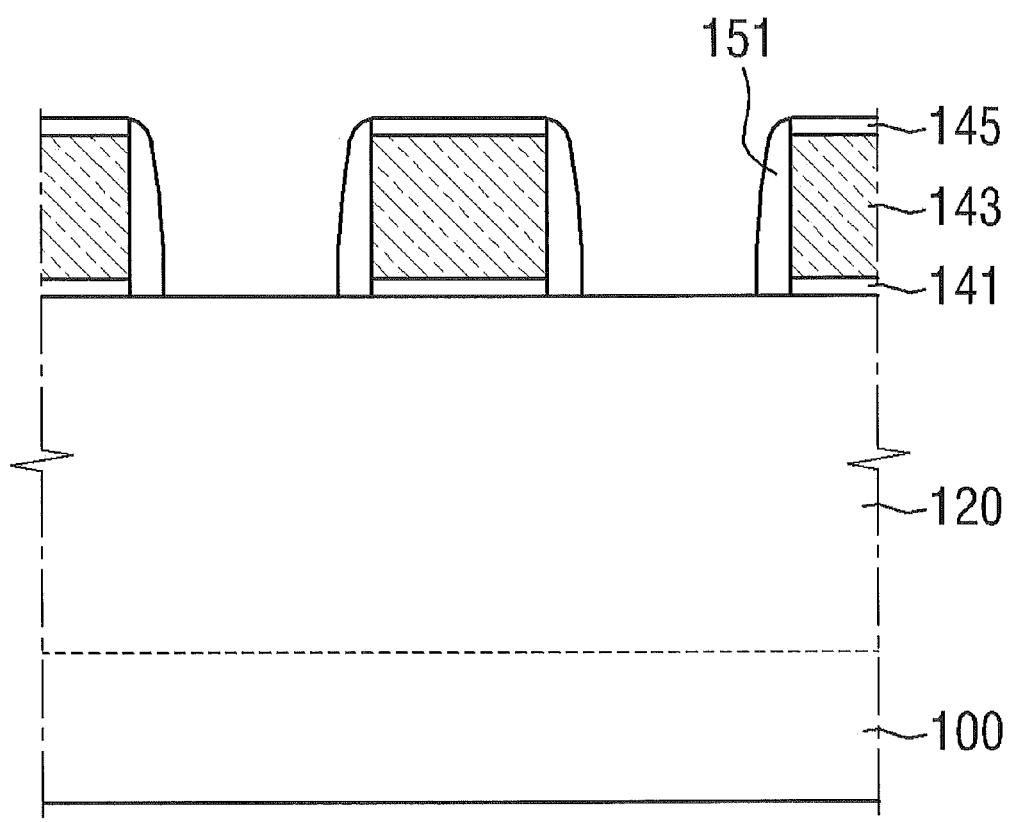

As illustrated in FIGS. 4 through 6, a first fin 310, a second fin 320, a third fin 330 and a fourth fin 340 may be formed to extend in one direction (for example, the vertical direction in FIG. 9). The second fin 320 and the third fin 330 may be shorter than the first fin 310 and the fourth fin 340.

A first gate electrode 351, a second gate electrode 352, a third gate electrode 353 and a fourth gate electrode 354 may be formed to extend in another direction (for example, the horizontal direction in FIG. 9) and to intersect the first, second, third and fourth fins 310, 320, 330 and 340. More specifically, the first gate electrode 351 may completely intersect the first fin 310 and the second fin 320, and may partially overlap an end of the third fin 330. The third gate electrode 353 may completely intersect the fourth fin 340 and the third fin 330, and may partially overlap an end of the second fin 320. The second gate electrode 352 and the fourth gate electrode 354 may be formed to intersect the first fin 310 and the fourth fin 340, respectively.

The first pull-up transistor PU1 is defined near the intersection between the first gate electrode 351 and the second fin 320. The first pull-down transistor PD1 is defined near the intersection between the first gate electrode 351 and the first fin 310. The first pass transistor PS1 is defined near the intersection between the second gate electrode 352 and the first fin 310. The second pull-up transistor PU2 is defined near the intersection between the third gate electrode 353 and the third fin 330. The second pull-down transistor PD2 is defined near the intersection between the third gate electrode 353 and the fourth fin 340. The second pass transistor PS2 is defined near the intersection between the fourth gate electrode 354 and the fourth fin 340.

Even though not specifically illustrated, a recess may be formed on both sides of each of the intersections between the first, second, third and fourth gate electrodes 351, 352, 353 and 354 and the first, second, third and fourth fins 310, 320, 330 and 340, respectively, and a source/drain region may be formed in each of the recesses.

A plurality of contacts 350 may also be formed.

A shared contact 361 connects the second fin 320, the third gate line 353 and wiring 371 at the same time. The shared contact 361 also connects the third fin 330, the first gate line 351 and wiring 362 at the same time.

The first pull-up transistor PU1, the first pull-down transistor PD1, the first pass transistor PS1, the second pull-up transistor PU2, the second pull-down transistor PD2 and the second pass transistor PS2 may all be implemented as fin-type transistors, i.e., semiconductor devices according to some embodiments of the present inventive concept, and may be configured to have the structure described above with reference to FIGS. 1 through 3.

A method of fabricating a semiconductor device, according to some embodiments of the present inventive concept will now be described with reference to FIGS. 7 through 11.

Figure 7:
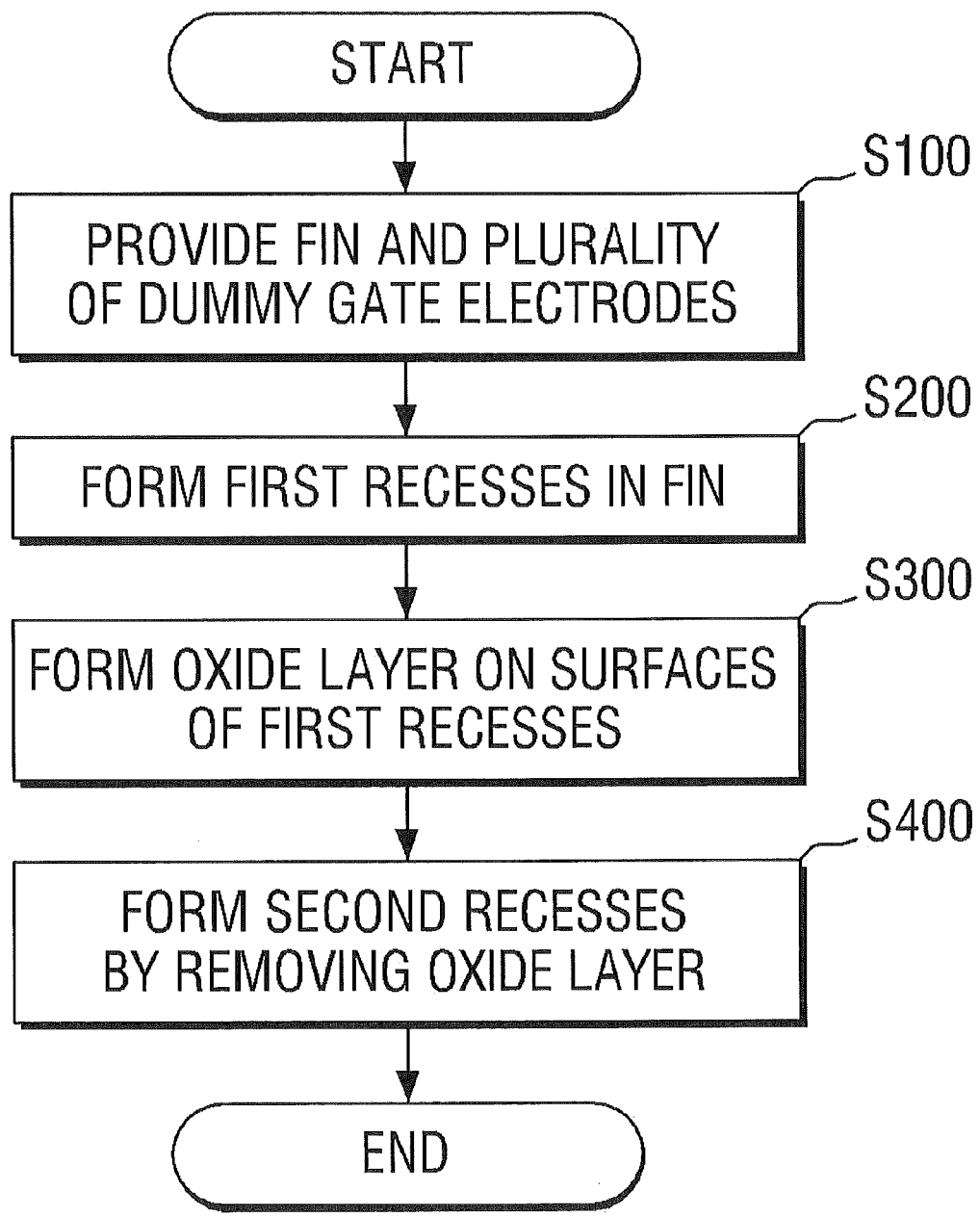
FIG. 7 is a flowchart illustrating a method of fabricating a semiconductor device, according to various embodiments of the present inventive concept.
Figure 8:
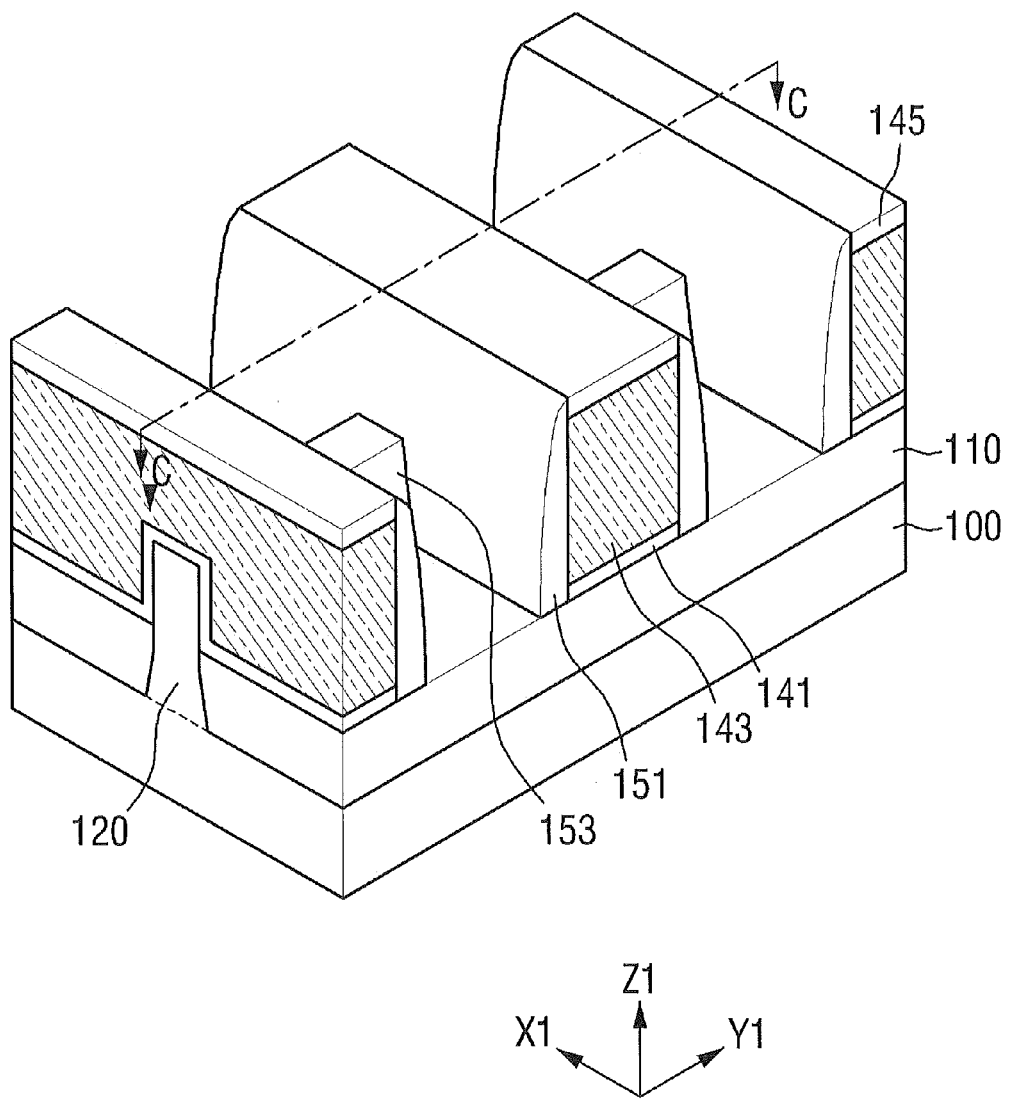
FIGS. 8 through 14 are views illustrating operations of the method, according to various embodiments.

FIG. 7 is a flowchart illustrating a method of fabricating a semiconductor device, according to various embodiments of the present inventive concept, and FIGS. 8 through 14 are views illustrating steps of the method. More specifically, FIGS. 8 and 14 are perspective views illustrating a method of fabricating a semiconductor device, according to various embodiment of the present inventive concept, and FIGS. 9 through 13 are cross-sectional views taken along line B-B of FIG. 8.

Referring to FIG. 7, a fin, which is formed to protrude from a substrate, and a plurality of dummy gate patterns, which are formed to intersect the fin, are provided (operation S100). More specifically, as illustrated in FIGS. 8 and 9, a fin 120 is formed to protrude from a substrate 100. The fin 120 may be formed to extend along a second direction Y1. The fin 120 may or may not be integrally formed with the substrate 100.

Doping for adjusting a threshold voltage may be performed on the fin 120. In response to a semiconductor device obtained by the method of fabricating a semiconductor device, according to an embodiment of the present inventive concept being an NMOS transistor, the fin 120 may be doped with impurities such as boron (B). Alternatively, a semiconductor device obtained by the method of fabricating a semiconductor device, according to an embodiment of the present inventive concept being a PMOS transistor, the fin 120 may be doped with impurities such as Phosphorus (P) or Arsenic (As). However, the present inventive concept is not limited to the impurities set forth herein. That is, the fin 120 may be doped with various impurities other than those set forth herein.

The fin 120 may be formed by various processes, for example, an epitaxial process or etching.

A device isolation layer 110 may be formed on the substrate 100. The device isolation layer 110 may be formed of a material including at least one of a silicon oxide layer, a silicon nitride layer and a silicon oxynitride layer.

A plurality of dummy gate insulation layers 141 and a plurality of dummy gate electrodes 143 are formed on the device isolation layer 110 and the fin 120. The dummy gate insulation layers 141 and the dummy gate electrodes 143 may be formed by performing etching with the use of a mask pattern 145. In an example, the dummy gate insulation layers 141 may include a silicon oxide layer, and the dummy gate electrodes 143 may include polysilicon.

A plurality of gate spacers 151 are formed on the sidewalls of the dummy gate electrodes 143, and a plurality of spacers 153 may be formed on the sidewalls of the fin 120. In an example, unlike in the examples illustrated in FIGS. 8 and 9, the gate spacers 151 may be formed to cover the top surface of the mask pattern 145. The gate spacers 151 may include at least one of a nitride layer, an oxynitride layer and a low-k material. The gate spacers 151 are illustrated in FIGS. 8 through 14 as being curved, but are not limited to the shape illustrated in FIGS. 8 through 14. In an example, the gate spacers 151 may be formed in an I- or L-shape. The gate spacers 151 are also illustrated in FIGS. 8 through 14 as having a single-layer structure, but may also be formed to have a multilayer structure.

Figure 10:
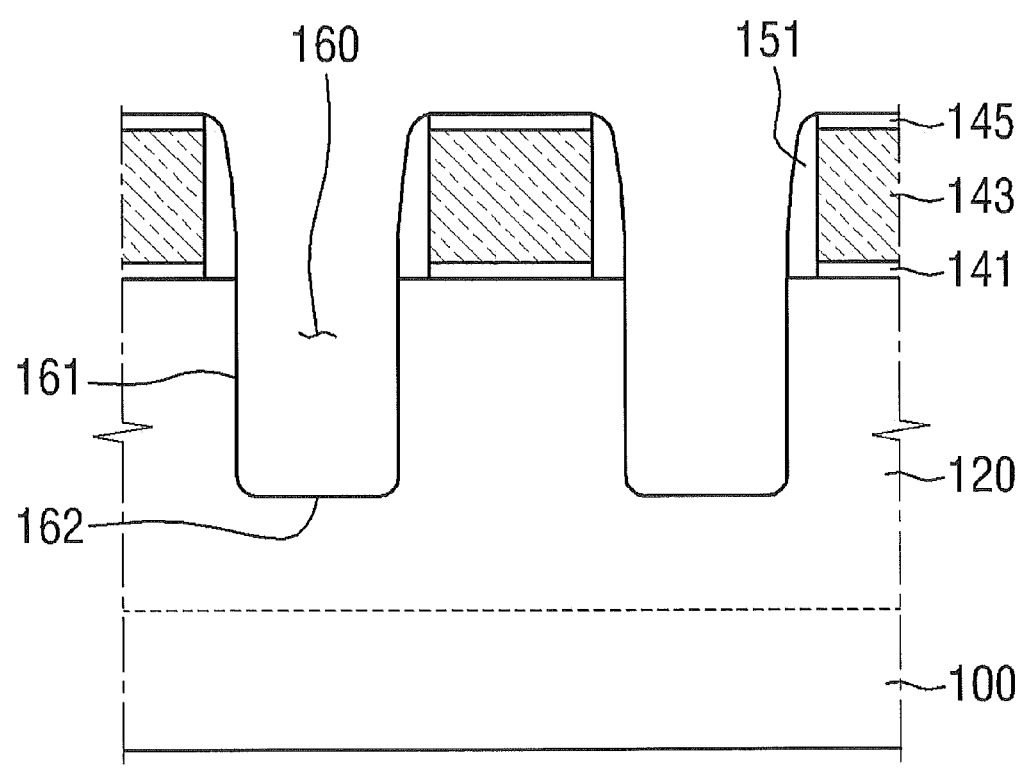
Figure 12:
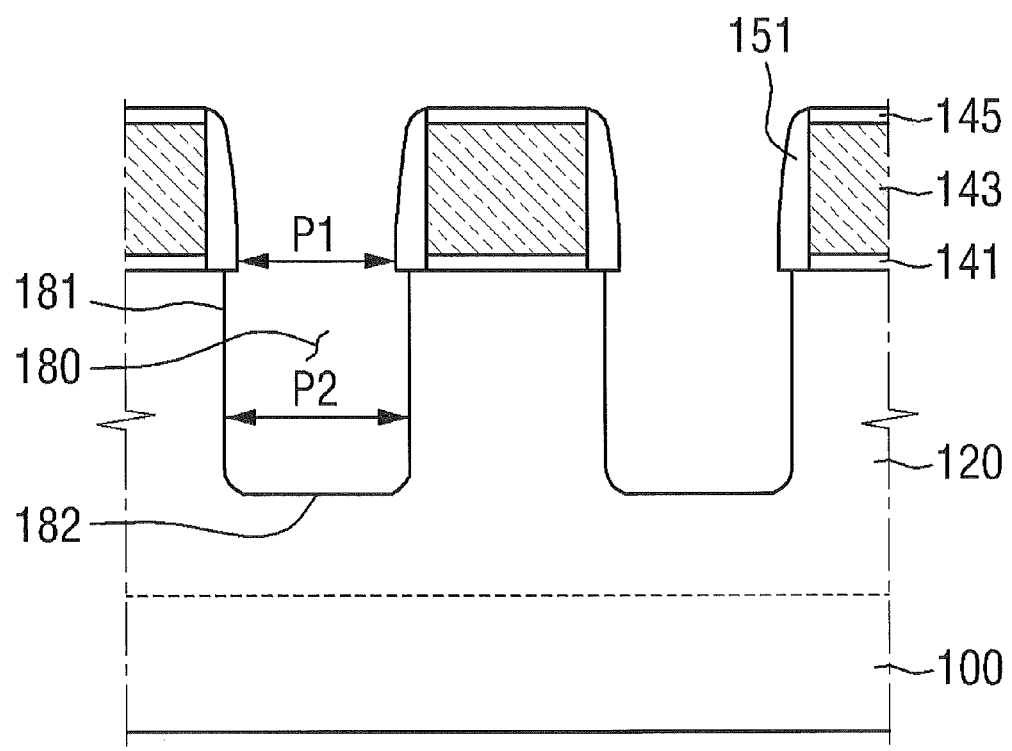

Referring to FIGS. 7 and 10, a first recess 160 is formed in the fin 120 on at least one side of each of the dummy gate electrodes 143 (operation S200). By dry etching, the first recesses 160 may be formed in a U shape. In response to the first recesses 160 being formed in a U shape, second recesses 180, which are formed by expanding the first recesses 160, may also be formed in the U shape, as illustrated in FIG. 12.

Figure 11:
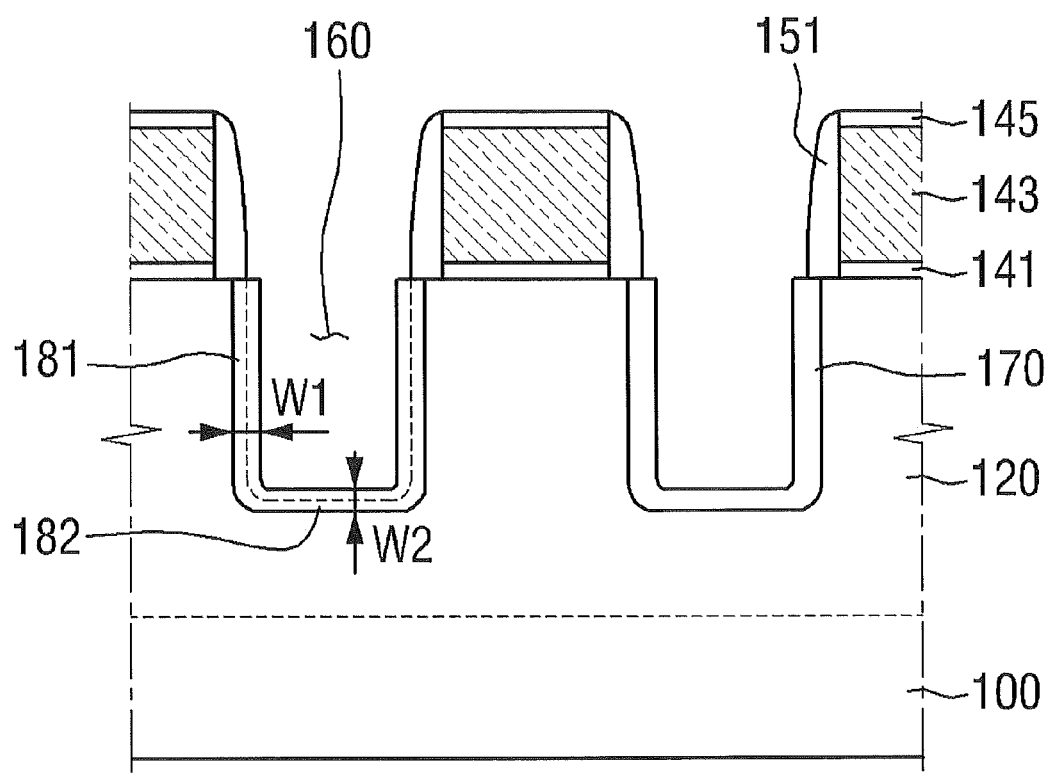

Referring to FIGS. 7, 10 and 11, an oxide layer 170 is formed in each of the first recesses 160 (operation S300). The oxide layer 170 may be formed by dry oxidation or wet oxidation. By using dry oxidation or wet oxidation, it is possible to evenly form the oxide layer 170 on first surfaces 161 and second surfaces 162.

Since the gate spacers 151 and the top surface of the mask pattern 145 include a different material from that of the fin 120, the gate spacers 151 and the top surface of the mask pattern 145 are not oxidized. Accordingly, the oxide layer 170 can be formed only in each of the first recesses 160.

The oxide layer 170 is formed on the first surfaces 161 of the first recesses 160 along the second direction Y and is formed on the second surfaces 162 of the first recesses 160 along a third direction Z1.

The oxide layer 170 may be formed not only on the surfaces of the first recesses 160 but also inside the fin 120 through the first recesses 160. Accordingly, the interfaces between the oxide layer 170 and the fin 120, i.e., first interfaces 181 and second interfaces 182, may be larger than the surfaces (i.e., the first surfaces 161 and the second surfaces 162) of the first recesses 160. The first interfaces 181 and the second interfaces 182 may become the surfaces of the second recesses 180, as illustrated in FIG. 12.

The thickness of the oxide layer 170, which is formed on the surfaces (i.e., the first surfaces 161 and the second surfaces 162) of the first recesses 160, may vary from one location to another location. More specifically, the oxide layer 170 may be thicker on the first surfaces 161 of the first recesses 160 than on the second surfaces 162 of the first recesses 160. That is, a thickness W1 of the oxide layer 170 on the first surfaces 161 may be greater than a thickness W2 of the oxide layer 170 on the second surfaces 162. In an example, the ratio of the thickness W2 to the thickness W1 may be 1:1.2 to 1:1.4. The first surfaces 161 may be the side surfaces of the first recesses 160, and the second surfaces 162 may be the bottom surfaces of the first recesses 160.

Once the first recesses 160 are formed by performing dry etching on the fin 120, the first surfaces 161 of the first recesses 160 contain more dangling bonds and can thus be combined with more oxygen than the second surfaces 162 of the first recesses 160. Accordingly, the thickness of the oxide layer 170 on the first surfaces 161, i.e., the thickness W1, may be greater than the thickness of the oxide layer 170 on the second surfaces 162, i.e., the thickness W2.

Referring to FIGS. 7, 11 and 12, the first recesses 160 are expanded into the second recesses 180 by removing the oxide layer 170 (operation S400). More specifically, the second recesses 180 are formed by completely removing the oxide layer 170 via dry etching and/or wet etching. The second recesses 180, which are obtained by forming and then removing the oxide layer 170, may be in a fuller U shape than the first recesses 160.

Once the oxide layer 170 is completely removed, the interfaces (i.e., the first interfaces 181 and the second interfaces 182) between the oxide layer 170 and the fin 120 may become the surfaces of the second recesses 180.

Since the second recesses 180 are U-shaped, the first surfaces 181 and the second surfaces 182 of the second recesses 180 may substantially form a right angle with each other. More specifically, the angle between the first surfaces 181 and the second surfaces 182 of the second recesses 180 may range from 87 degrees to 90 degrees.

Since the second recesses 180 are formed by removing the oxide layer 170, the second recesses 180 may be wider and deeper than the first recesses 160. More specifically, the height of the second recesses 180 may be greater than the height of the first recesses 160, and a width P2 of the second recesses 180 (i.e., the distance between the first surfaces 181 of each of the second recesses 180) may be greater than the width of the first recesses 160 (i.e., the distance between the first surfaces 161 of each of the first recesses 160). A pitch P1 of the gate spacers 151 may be less than the width P2 of the second recesses 180, wherein the pitch P1 of the gate spacers 151 may indicate the distance between a pair of adjacent gate spacers 151.

Since P2>P1, bottom surfaces 151a of the gate spacers 151 may be partially exposed, but the dummy gate insulation layers 141 are not exposed.

During the removal of the oxide layer 170, the fin 120 may be partially over-etched so that the surfaces of the second recesses 180 may be larger than the interfaces (i.e., the first interfaces 181 and the second interfaces 182) between the oxide layer 170 and the fin 120. In this example, the pitch P1 of the gate spacers 151 may be even greater than the width P2 of the second recesses 180.

Figure 13:
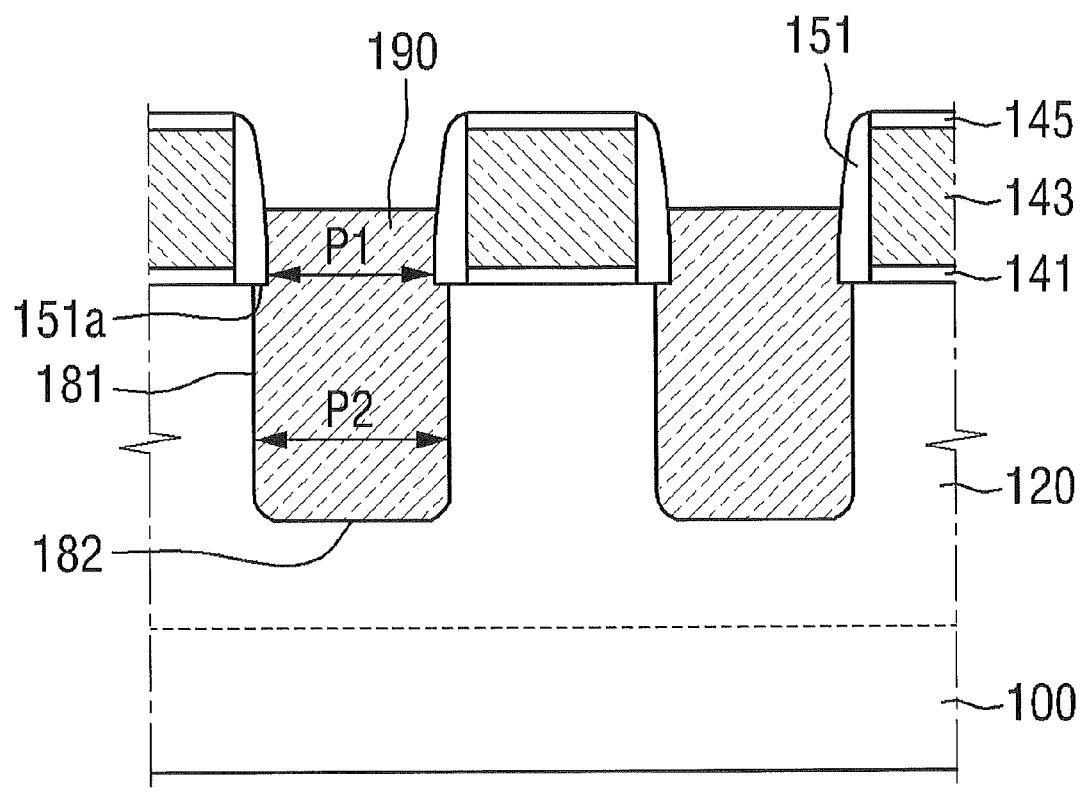

Referring to FIGS. 13 and 14, source/drain regions 190 are formed in the second recesses 180, respectively. The source/drain regions 190 may be formed by epitaxial growth. The top surfaces of the source/drain regions 190 may be higher than the bottom surfaces 151a of the gate spacers 151. The source/drain regions 190 may be formed to any desired height by planarization.

As described above, the second recesses 180 are obtained by oxidizing the surfaces of the first recesses 160 so as to form the oxide layer 170 and removing the oxide layer 170 so as to expand the first recesses 160, the surfaces of the second recesses 180 may be smooth. Accordingly, it is possible to prevent any defects from occurring in the source/ drain regions 190 during the formation of the source/drain regions 190 by epitaxial growth. Also, it is possible to prevent the source/drain regions 190 having a un-desired shape and reduce the occurrence of a leakage current.

In addition, since the source/drain regions 190 can be formed near a channel region by expanding the first recesses 160 into the second recesses 180, it is possible to increase the compressive or tensile stress applied to the channel region and, as a result, to improve the performance of transistors.

After the formation of the source/drain regions 190, the gate insulation layer 142 of FIG. 1 and the gate electrodes 147 of FIG. 1 are formed by removing the mask pattern 145, the dummy gate electrodes 143 and the dummy gate insulation layers 141, and the silicide layer 200 and the contacts 210 of FIG. 1 are formed on the source/drain regions 190. As a result, the semiconductor device illustrated in FIG. 1 may be obtained.

Figure 15:
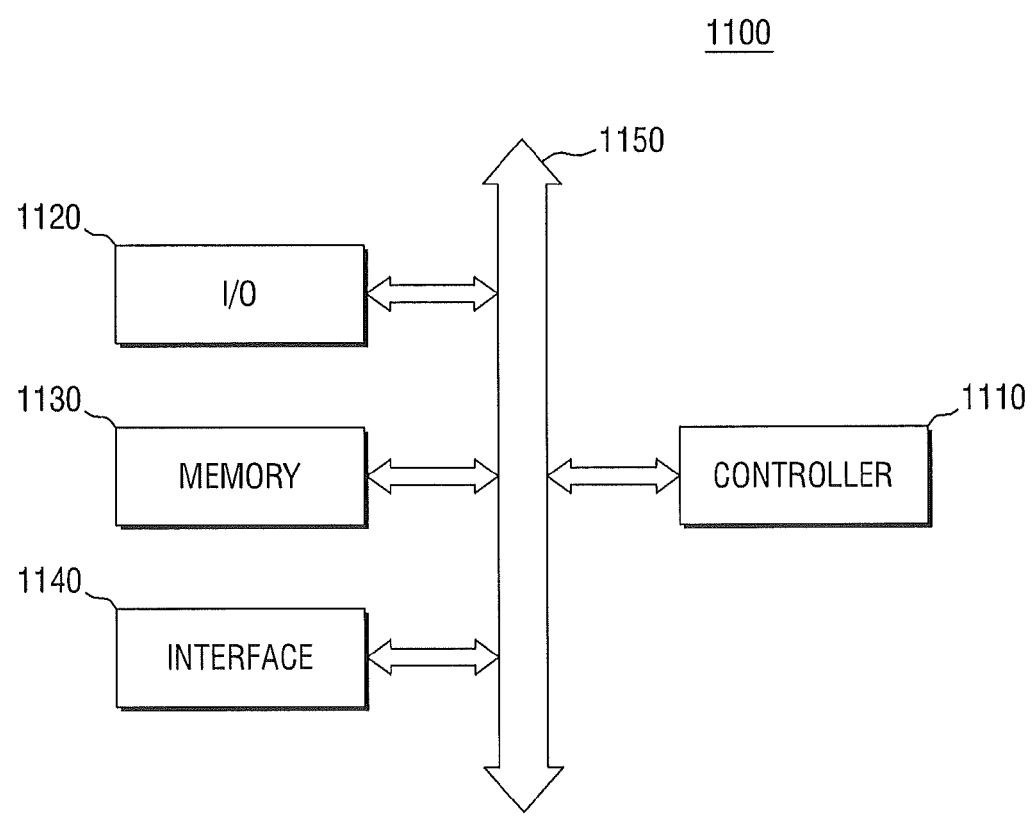
FIG. 15 is a block diagram illustrating an electronic system including semiconductor devices according to various embodiments of the present inventive concept.

FIG. 15 is a block diagram illustrating an electronic system including semiconductor devices according to various embodiments of the present inventive concept.

Referring to FIG. 15, an electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver. The electronic system 1100 may be an operating memory for improving the operation of the controller 1110, and may also include a high-speed dynamic random access memory (DRAM) or SRAM. Fin field effect transistors (FinFETs) according to embodiments of the present inventive concept may be provided in the memory device 1130 or in the controller 1110 or the I/O device 1120.

The electronic system 1100 may be applied to nearly all types of electronic products capable of transmitting or receiving information in a wireless environment, such as a personal digital assistant (PDA), a portable computer, a web tablet, a wireless phone, a mobile phone, a digital music player, a memory card, etc.

Figure 16:
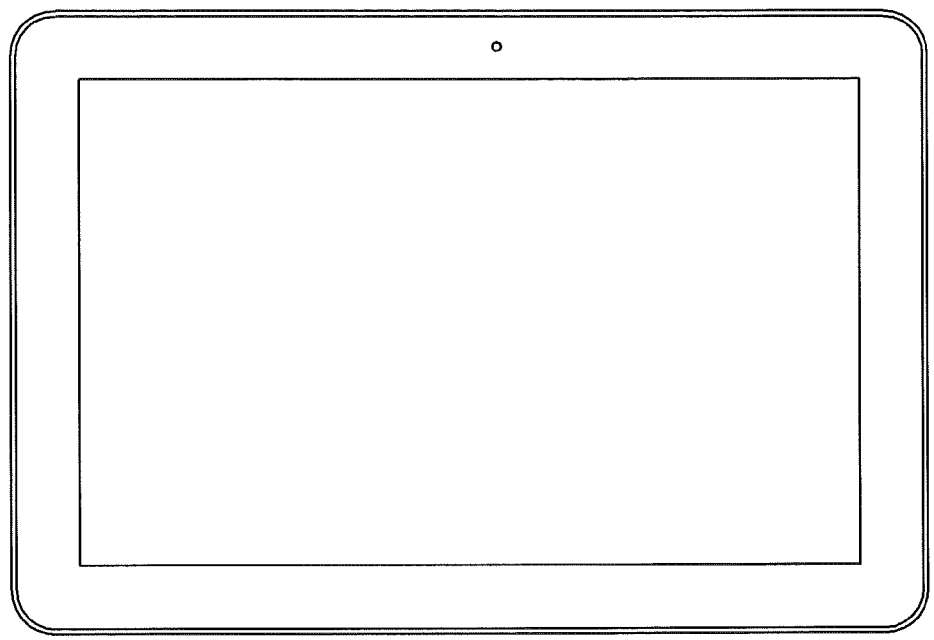
FIGS. 16 and 17 are diagrams illustrating an example of a semiconductor system to which semiconductor devices according to various embodiments of the present inventive concept can be applied.
Figure 17:
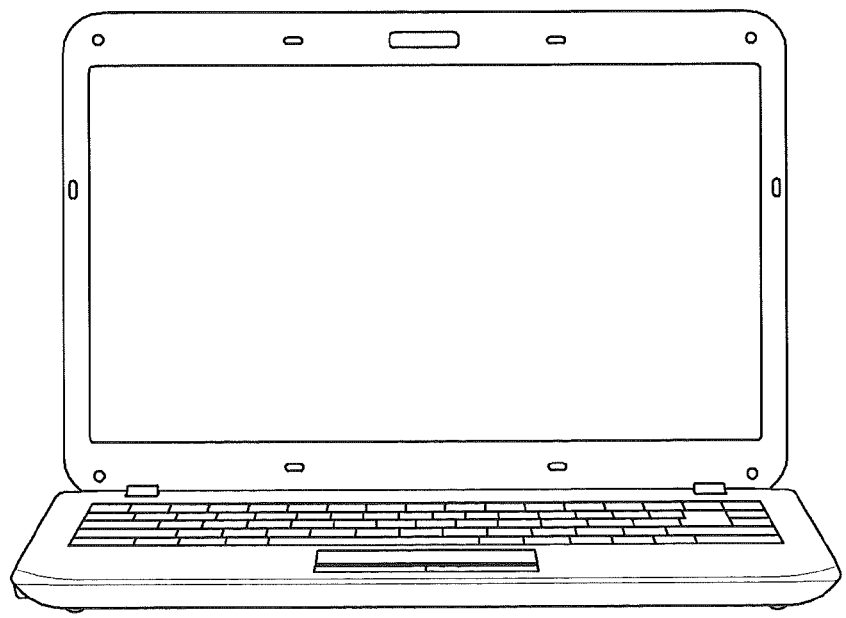

FIGS. 16 and 17 are diagrams illustrating an example of a semiconductor system to which semiconductor devices according to various embodiments of the present inventive concept can be applied. More specifically, FIG. 16 illustrates a tablet personal computer (PC), and FIG. 17 illustrates a laptop computer. At least one of the semiconductor devices according to embodiments of the present inventive concept, as set forth herein, may be used in a tablet PC or a laptop computer. The semiconductor devices according to embodiments of the present inventive concept, as set forth herein, may also be applied to various integrated circuit (IC) devices other than those set forth herein.

While the present inventive concept has been particularly shown and described with reference to embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of fabricating a semiconductor device, the method comprising:
   providing a fin formed to protrude from a substrate and a plurality of gate electrodes formed on the fin to intersect the fin, the gate electrodes comprising gate spacers on sidewalls thereof;
   forming first recesses in the fin on at least one side of the respective gate electrodes;
   forming an oxide layer in the first recesses;
   expanding the first recesses into second recesses by removing the oxide layer and partially exposing respective bottom surfaces of the gate spacers;
   forming source/drain regions in the second recesses by epitaxial growth, wherein the gate electrodes comprise dummy gate electrodes;
   removing the dummy gate electrodes after forming the source/drain regions in the second recesses; and
   forming a metal layer on the fin after removing the dummy gate electrodes.

2. The method of claim 1, wherein the second recesses are U-shaped.

3. The method of claim 1, wherein first and second surfaces of each of the second recesses substantially form a right angle with each other.

4. The method of claim 3, wherein an angle between the first and second surfaces of each of the second recesses is 87 degrees to 90 degrees.

5. The method of claim 1, wherein the forming the first recesses comprises forming the first recesses by dry etching.

6. The method of claim 1, wherein the forming the oxide layer comprises forming the oxide layer by dry oxidation or wet oxidation.

7. The method of claim 1, wherein the forming the oxide layer comprises forming the oxide layer so that the oxide layer is thicker on a side surface than on a bottom surface of each of the first recesses.

8. The method of claim 7, wherein the forming the oxide layer comprises forming the oxide layer so that a ratio of a first thickness of the oxide layer on the bottom surface to a second thickness of the oxide layer on the side surface is 1:1.2 to 1:1.4.

9. The method of claim 1,
   wherein a pitch of the gate spacers is less than a width of the second recesses.

10. The method of claim 1, wherein the source/drain regions comprise a first width that is wider than a second width of the fin.

11. The method of claim 1,
   wherein forming the source/drain regions comprises forming the source/drain regions on the respective bottom surfaces of the gate spacers,
   the method further comprising forming a silicide layer on the source/drain regions, after forming the source/drain regions in the second recesses and on the respective bottom surfaces of the gate spacers.

12. A method of forming a semiconductor device, the method comprising:

forming first through fourth recesses adjacent first through fourth intersections, respectively, between first through fourth gate electrodes and respective first through fourth semiconductor fins;

forming an oxide layer in the first through fourth recesses;

expanding the first through fourth recesses by removing the oxide layer;

forming first through fourth source/drain regions in the first through fourth recesses after the expanding, wherein the first through fourth gate electrodes comprise first through fourth dummy gate electrodes, respectively, and removing the first through fourth dummy gate electrodes after forming the first through fourth source/drain regions in the expanded first through fourth recesses; and forming a metal layer on the first through fourth semiconductor fins after removing the first through fourth dummy gate electrodes.

13. The method of claim 12, wherein the first through fourth semiconductor fins extend in a first direction, wherein the first through fourth gate electrodes extend in a second direction intersecting the first direction, and wherein the second and third semiconductor fins are between the first and fourth semiconductor fins and extend a shorter distance in the first direction than the first and fourth semiconductor fins.

14. The method of claim 12, wherein the expanding the first through fourth recesses comprises partially exposing respective bottom surfaces of spacers on the first through fourth gate electrodes.

15. A method of forming a semiconductor device, the method comprising:

forming first through third spaced-apart dummy gate electrodes on first and second sidewalls of a fin that protrudes from a substrate, each of the first through third dummy gate electrodes overlapping the fin, the first through third dummy gate electrodes comprising spacers on sidewalls thereof;

forming a first recess in the fin adjacent the first and second dummy gate electrodes and a second recess in the fin adjacent the second and third dummy gate electrodes;

forming an oxide layer in the first and second recesses;

expanding the first and second recesses by removing the oxide layer and partially exposing respective bottom surfaces of the spacers on the first through third dummy gate electrodes; and forming first and second source/drain regions in the first and second recesses and on the respective bottom surfaces of the spacers after the expanding.

16. The method of claim 15, further comprising:

removing the first through third dummy gate electrodes after forming the source/drain regions in the expanded first and second recesses; and forming a metal layer on the fin after removing the first through third dummy gate electrodes.

* * * * *